US008592941B2

(12) United States Patent
Gambino et al.

(10) Patent No.: US 8,592,941 B2
(45) Date of Patent: Nov. 26, 2013

(54) FUSE STRUCTURE HAVING CRACK STOP VOID, METHOD FOR FORMING AND PROGRAMMING SAME, AND DESIGN STRUCTURE

(75) Inventors: Jeffrey P. Gambino, Westford, VT (US); Tom C. Lee, Essex Junction, VT (US); Kevin G. Petrunich, Williston, VT (US); David C. Thomas, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 12/838,850

(22) Filed: Jul. 19, 2010

(65) Prior Publication Data

US 2012/0012976 A1    Jan. 19, 2012

(51) Int. Cl.
*H01L 21/82* (2006.01)
*H01L 21/326* (2006.01)
*H01L 21/44* (2006.01)
*H01L 23/52* (2006.01)

(52) U.S. Cl.
USPC ............. 257/529; 257/209; 257/E21.592; 257/E23.149; 257/E21.573; 438/132; 438/467; 438/601

(58) Field of Classification Search
USPC ............ 257/529, 48, E23.149, E21.592, 209; 438/132, 215, 281, 333, 466, 467, 468, 438/469, 601, FOR. 433
See application file for complete search history.

(56) References Cited

U.S. PATENT DOCUMENTS

| | | | |
|---|---|---|---|
| 4,089,734 A | 5/1978 | Bierig | |
| 4,879,587 A | 11/1989 | Jerman et al. | |
| 5,139,852 A | 8/1992 | Baise et al. | |
| 5,537,108 A * | 7/1996 | Nathan et al. ................. | 257/529 |
| 5,652,459 A | 7/1997 | Chen | |
| 5,723,898 A | 3/1998 | Gilmour et al. | |
| 5,834,829 A | 11/1998 | Dinkel et al. | |
| 6,219,215 B1 | 4/2001 | Bertin et al. | |
| 6,448,113 B2 | 9/2002 | Lee et al. | |
| 6,486,526 B1 | 11/2002 | Narayan et al. | |
| 6,495,918 B1 | 12/2002 | Brintzinger | |
| 6,525,398 B1 | 2/2003 | Kim et al. | |
| 6,563,188 B2 | 5/2003 | Nagatini | |
| 6,633,055 B2 | 10/2003 | Bertin et al. | |
| 2001/0005617 A1 | 6/2001 | Feurle et al. | |
| 2001/0054745 A1 | 12/2001 | Tsai | |
| 2002/0017704 A1 | 2/2002 | Yajima | |
| 2002/0113291 A1 | 8/2002 | Adkisson et al. | |
| 2003/0227089 A1 | 12/2003 | Watanabe et al. | |

(Continued)

OTHER PUBLICATIONS

Daubenspeck, U.S. Appl. No. 11/277,398, filed Mar. 24, 2006, Notice of Allowance and Fee(s) Due dated Sep. 15, 2008, 6 pages.

*Primary Examiner* — Julio J Maldonado
*Assistant Examiner* — Cory Eskridge
(74) *Attorney, Agent, or Firm* — Anthony J. Canale; Hoffman Warnick LLC

(57) ABSTRACT

The disclosure relates generally to fuse structures, methods of forming and programming the same, and more particularly to fuse structures having crack stop voids. The fuse structure includes a semiconductor substrate having a dielectric layer thereon and a crack stop void. The dielectric layer includes at least one fuse therein and the crack stop void is adjacent to two opposite sides of the fuse, and extends lower than a bottom surface and above a top surface of the fuse. The disclosure also relates to a design structure of the aforementioned.

20 Claims, 8 Drawing Sheets

(56) References Cited

U.S. PATENT DOCUMENTS

| | | |
|---|---|---|
| 2004/0129938 A1 | 7/2004 | Landers et al. |
| 2005/0189613 A1* | 9/2005 | Otsuka et al. ................. 257/529 |
| 2008/0052659 A1* | 2/2008 | Booth et al. .................... 716/14 |
| 2009/0149013 A1* | 6/2009 | Daubenspeck et al. ....... 438/601 |

* cited by examiner

FUSE STRUCTURE HAVING CRACK STOP VOID, METHOD FOR FORMING AND PROGRAMMING SAME, AND DESIGN STRUCTURE

TECHNICAL FIELD

The disclosure relates generally to fuse structures, methods for forming and programming the same, and more particularly, to fuse structures having crack stop voids. The disclosure also relates to a design structure of the aforementioned.

BACKGROUND

Semiconductor integrated circuits (IC) and their manufacturing techniques are known in the art. In typical ICs, a large number of semiconductor devices are fabricated on a silicon substrate. To achieve the desired functionality, a plurality of conductors or interconnects are typically employed for coupling selected devices together. In some ICs, some of the conductive links may be coupled to fuses which may be selectively programmed (i.e., blown) after fabrication.

SUMMARY

An aspect of the present invention relates to a fuse structure comprising: a semiconductor substrate; a dielectric layer thereon, the dielectric layer including at least one fuse therein; and a crack stop void adjacent to two opposite sides of the fuse, and extending lower than a bottom surface and above a top surface of the fuse.

A second aspect of the present invention relates to a method for forming a fuse structure comprising: providing a semiconductor substrate; forming a dielectric layer thereon; forming at least one fuse within the dielectric layer; and forming a crack stop void adjacent to two opposite sides of the fuse, and extending lower than a bottom surface and above a top surface of the fuse.

A third aspect of the present invention relates to a design structure embodied in a machine readable medium for designing, manufacturing, or testing a fuse structure, the design structure comprising: a semiconductor substrate; a dielectric layer thereon, the dielectric layer including at least one fuse therein; and a crack stop void adjacent to two opposite sides of the fuse, and extending lower than a bottom surface and above a top surface of the fuse.

A fourth aspect of the present invention relates to a method for programming a fuse comprising: providing a fuse structure comprising: a semiconductor substrate; a dielectric layer thereon, the dielectric layer including at least one fuse therein; and a crack stop void adjacent to two opposite sides of the fuse, and extending below a lower surface and above a top surface of the fuse; providing a current supply operatively coupled to the fuse; and applying a programming current from the current supply to the fuse resulting in the fuse being programmed.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

It has been discovered that during a fuse blow operation where fuses are opened, for example by a laser, damage to inter-level dielectric layers such as a low-k dielectric layer and a silicon nitride/silicon oxide dielectric may occur due to separation of the aforementioned from each other. The separation of layers may cause an incorrect programming of a nearby fuse. It has also been discovered that damage caused to a surrounding area during a fuse blow operation may extend to adjacent un-blown fuses.

Figure 1:
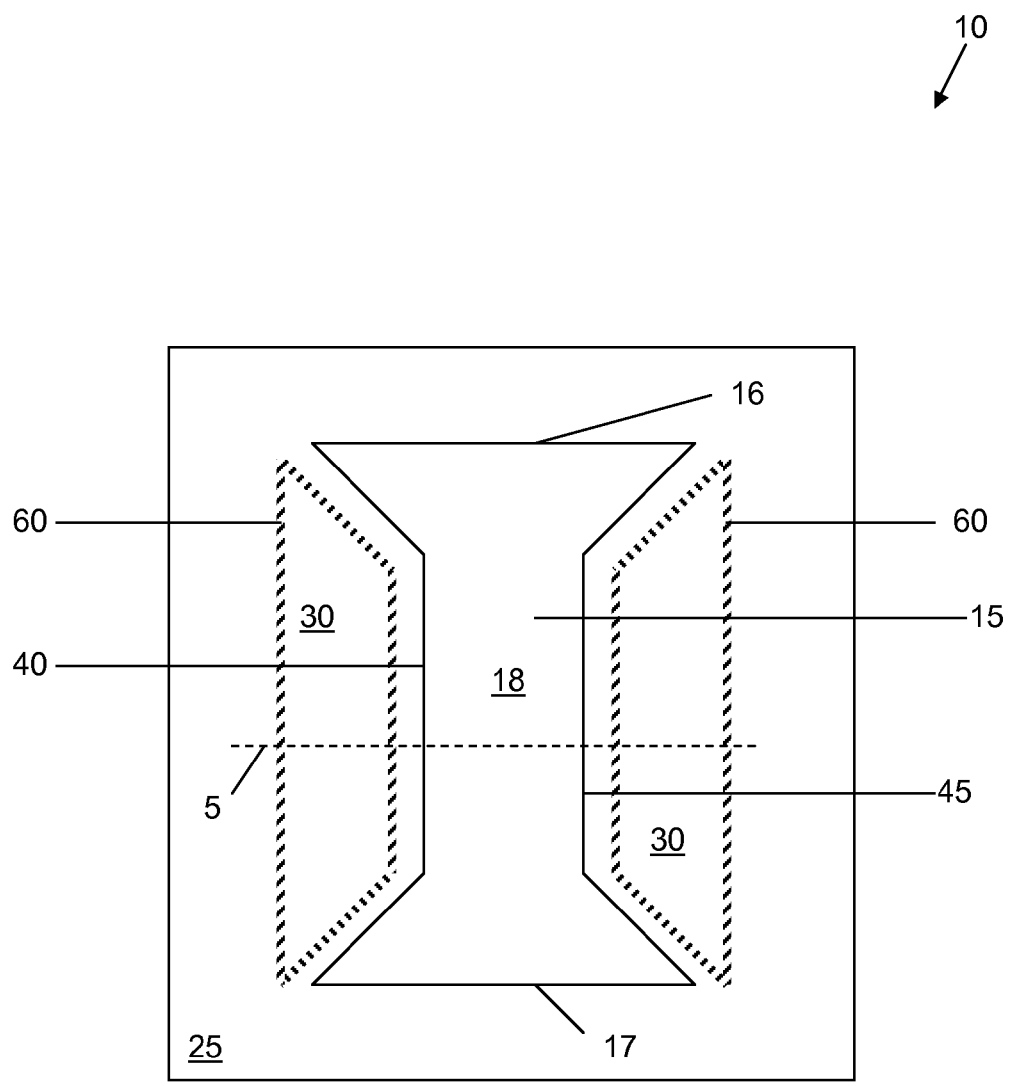
FIG. 1 depicts a top-down view of an embodiment of a fuse structure, in accordance with the present invention.
Figure 2:
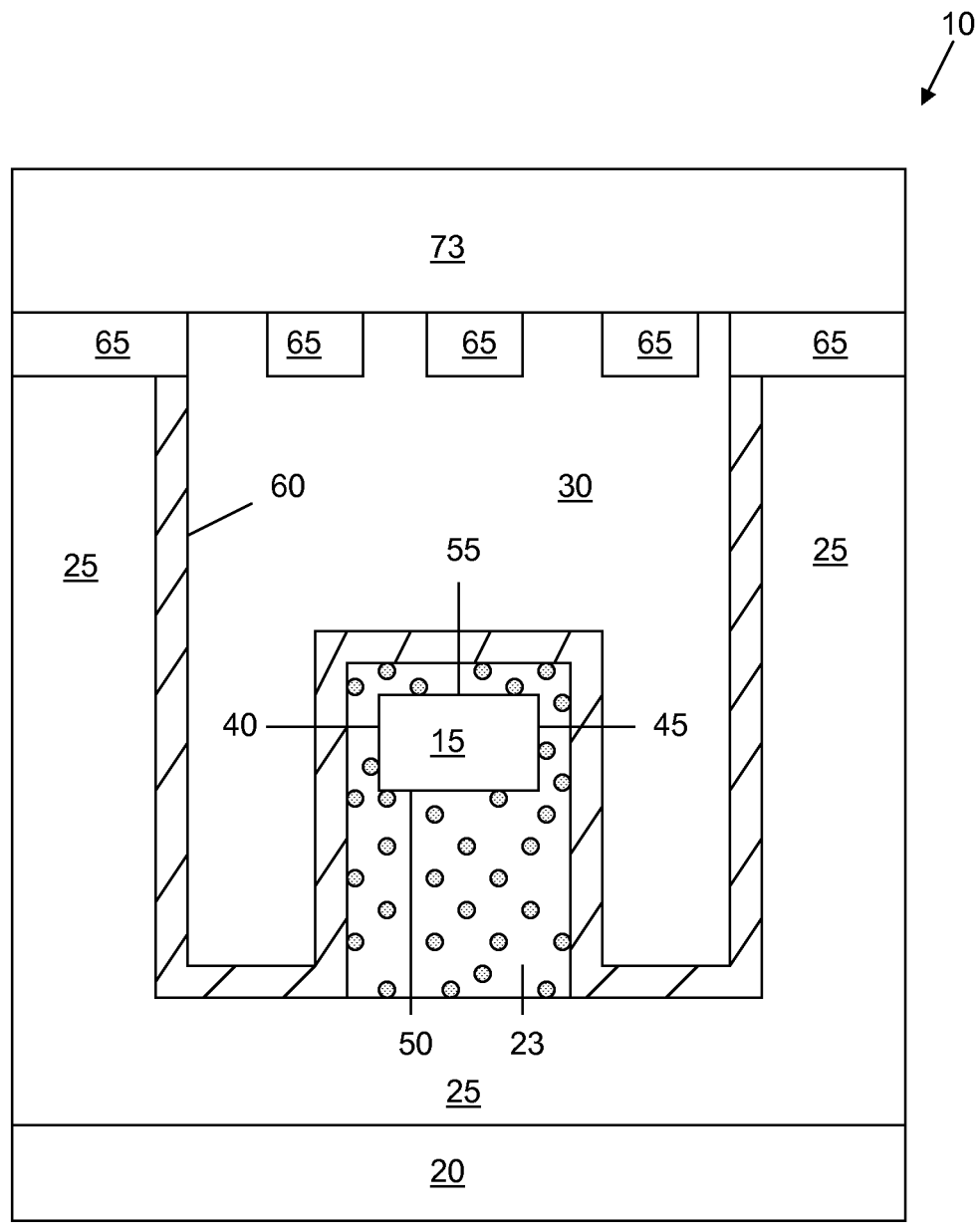
FIG. 2 depicts a cross-sectional view of an embodiment of a fuse structure, in accordance with the present invention.

A top-down view of an embodiment of a fuse structure is presented in FIG. 1 and a cross-sectional view of an embodiment of a fuse structure is presented in FIG. 2, in accordance with the present invention. Dashed line 5 of FIG. 1 represents a cross-sectional cut of FIG. 2. Referring to FIGS. 1 and 2, a fuse structure 10 is shown having a fuse 15 formed on a substrate 20. As shown in FIG. 1, fuse 15 comprises a first conductive area 16 and a second conductive area 17 coupled by a fuse link 18. Fuse 15 is positioned within a dielectric layer 25 which is on substrate 20. Fuse 15 may be formed from a metal, for example, copper or aluminum.

Substrate 20 may be a semiconductor substrate comprised of but not limited to silicon, germanium, silicon germanium, silicon carbide, and those consisting essentially of one or more Group III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Semiconductor substrate 20 may also be comprised of Group II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The processes to provide semiconductor substrate 20, as illustrated and described, are well known in the art. In an embodiment of the present invention, semiconductor substrate 20 may comprise a p-type doped substrate. Examples of p-type dopants include but are not limited to boron (B), indium (In), and gallium (Ga).

Dielectric layer 25 may be a material such as, but not limited to silicon oxide ($SiO_2$), silicon nitride ($Si_3N_4$), hafnium oxide ($HfO_2$), hafnium silicon oxide (HfSiO), hafnium silicon oxynitride (HfSiON), zirconium oxide ($ZrO_2$), zirconium silicon oxide (ZrSiO), zirconium silicon oxynitride (ZrSiON), aluminum oxide ($Al_2O_3$), titanium oxide ($Ti_2O_5$), tantalum oxide ($Ta_2O_5$), hydrogen silsesquioxane polymer (HSQ); methyl silsesquioxane polymer (MSQ); SiLK™ (polyphenylene oligomer) manufactured by Dow Chemical, Midland, Mich.; Black Diamond™ [$SiO_x$ $(CH_3)_y$] manufactured by Applied Materials, Santa Clara, Calif.; fluorinated tetraethylorthosilicate (FTEOS), and fluorinated silicon glass (FSG).

Dielectric layer 25 may also comprise multiple dielectric layers, for example, a first low-k (dielectric constant) layer and a second dielectric layer such as silicon nitride and/or silicon oxide. The second dielectric layer may have a higher k dielectric constant value than the first low-k dielectric layer. Low-k dielectric layers include materials having a relative permittivity value of 4 or less, examples of which include but are not limited to HSQ, MSQ, SiLK™ Black Diamond™ FTEOS, and FSG.

Fuse structure 10 may also include a crack stop void 30 adjacent to opposite sides 40 and 45 of fuse 15, and, as shown in FIG. 2, extending lower than a bottom surface 50 of fuse 15. Crack stop void 30 may also extend above a top surface 55 of fuse 15. Crack stop void 30 may be absent of solid material such that a void is formed. Crack stop void 30 may comprise a fluid such as a gas or air, or may comprise a vacuum. An inner surface of crack stop void 30 may include a lining 60 comprising a material selected from, for example, silicon nitride, silicon carbide, and silicon carbon nitride. Crack stop void 30 may prevent damage in dielectric layer 25 caused by a fuse blow operation on fuse 15 from propagating to an adjacent fuse structure.

In one embodiment, fuse 15 may be viewed as being in contact with and surrounded entirely by a portion 23 of dielectric layer 25. Portion 23 extends from a bottom of crack stop void 30 upward and into crack stop void 30 (i.e., like a pedestal or mesa) with fuse 15 located within an upper most region of portion 23. Portion 23 extending from the bottom of dielectric layer 25 as well as areas of dielectric layer 25 surrounding crack stop void 30 are conformally coated with lining 60.

Fuse structure 10 may additionally include a masking layer 65 and a non-conformal dielectric layer 73. In an embodiment, masking layer 65 and dielectric layer 73 coat dielectric layer 25 and seal crack stop void 30. Masking layer 65 may include, for example, silicon nitride (SiN) and silicon cyanide (SiCN). Conformal dielectric layer 73 may include, for example, $SiO_2$ or SiCOH (carbon doped $SiO_2$) composite film, deposited over masking layer 65 to form a seal for crack stop void 30.

It has been observed that wafers having crack stop voids 30 incorporated into fuse structures may have a lower number of reliability fails compared to wafers which do not have crack stop voids 30. In conventional integrated circuit fuse designs, fuses placed in a row inside a fuse bank typically cannot be reliably used when fuse pitches (distance between adjacent fuses) fall below approximately 3 micrometers (μm). This situation occurs because lasers that are typically used for blowing fuses have a wavelength of the order of approximately 1 μm to approximately 1.3 μm. As a result, the smallest spot that can be focused on by a laser is approximately 2 μm to approximately 2.6 μm. This, coupled with the uncertainty associated with the positioning of the substrate relative to the laser spot renders the blowing of fuses an unreliable operation.

For fuse pitches less than 3 μm, the probability of damaging a neighboring fuse increases as the pitch decreases. The introduction of a crack stop filled with material, e.g., metal between fuses, will also not work at these tight pitches as the crack stop itself will be ablated by the laser causing damage to adjacent fuses or circuit elements. In an embodiment of crack stop void 30 described herein, crack stop void 30 is made by removing material and thus, damage to crack stop void 30 due to a laser beam is virtually eliminated. Subsequently, it is possible to space fuses down to a pitch of approximately 2.2 μm without damaging adjacent fuses during a fuse blow operation. Moreover, an embodiment of crack stop void 30 of the present invention still performs the function of stopping cracks from damaging neighboring fuses. Thus, spacing of fuses consistent with conventional silicon oxide fuse integration may be achieved without an increase in footprint.

Figure 3A:
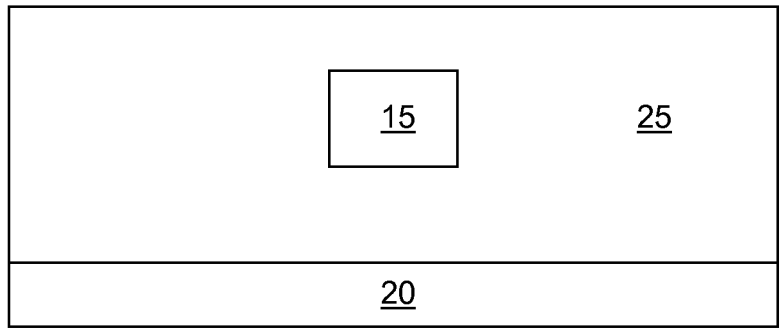
FIGS. 3A-3G depicts steps of an embodiment of a method for forming a fuse structure, in accordance with the present invention.

An embodiment of steps of a method for forming a fuse structure 10 according to an embodiment of the present invention are shown in FIGS. 3A-3G. Referring to FIG. 3A, substrate 20 comprising silicon, silicon-on-insulator, silicon germanium, or gallium arsenide may be provided already having a dielectric layer 25 thereon. Alternatively, dielectric layer 25 may be deposited on substrate 30 using any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

In an embodiment, dielectric layer 25 may be a low-k dielectric layer such as SiLK™, SiCOH, Black Diamond™, FTEOS, or FSG. Dielectric layer 25 is formed in a back-end-of-line (BEOL) process. BEOL process is the portion of integrated circuit fabrication line where the active components (transistors, resistors, etc.) are interconnected with wiring on the wafer. BEOL generally begins when the first layer of metal is deposited on the wafer. It includes contacts, insulator, dielectric layers, metal levels, and bonding sites for chip-to-package connections. Dicing the wafer into individual integrated circuit chips may also be included in BEOL process. Fuse 15 is formed in dielectric layer 25 by conventional processes such as standard etch and lithographic processes, for example, a damascene process including photolithography, deposition of metal, and chemical mechanical polishing. Fuse 15 can be formed at any metal layer and is not limited to being formed at the last metal layer. Further, deposition of dielectric layer 25 or an additional dielectric layer over fuse 15 may be necessary as would be recognized by one having ordinary skill in the art.

Figure 3B:
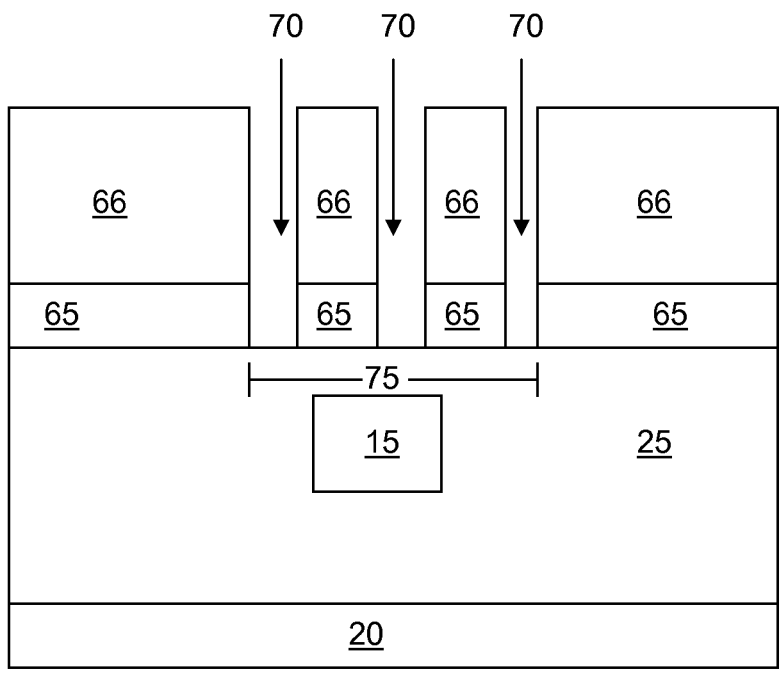

Referring to FIG. 3B, a masking layer 65 is formed on dielectric layer 25 and patterned for crack stop void 30 by conventional photolithographic processes using photoresist 66. The patterning results in the formation of openings 70 in masking layer 65. Masking layer 65 may be silicon nitride and photoresist 66 may be positive or negative tone photoresist materials known in the art. Openings 70 are formed substantially above fuse 15 over a region 75 of dielectric layer 25.

Figure 3C:
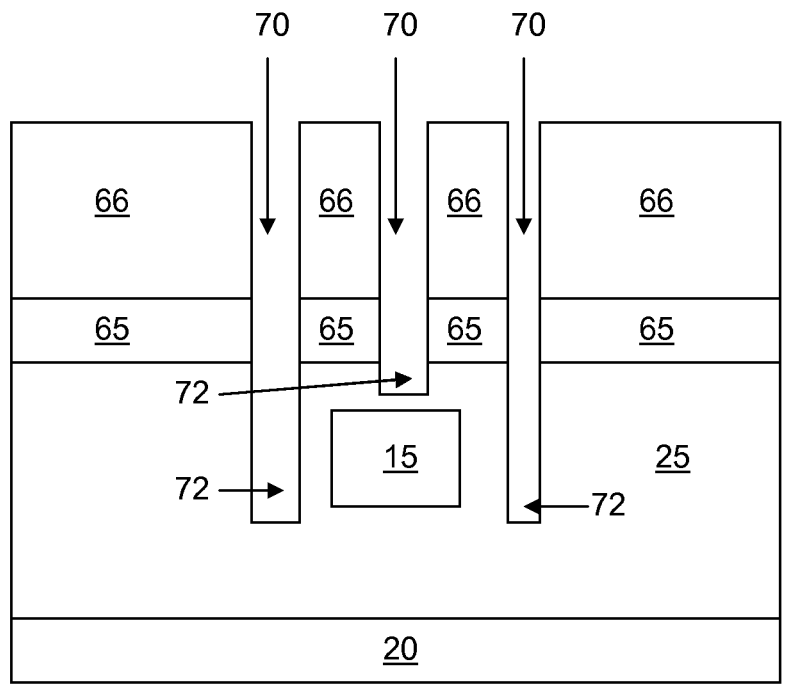
Figure 3D:
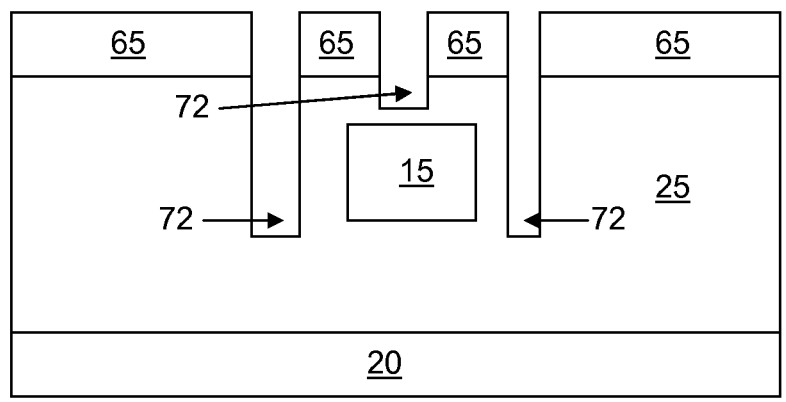
Figure 3E:
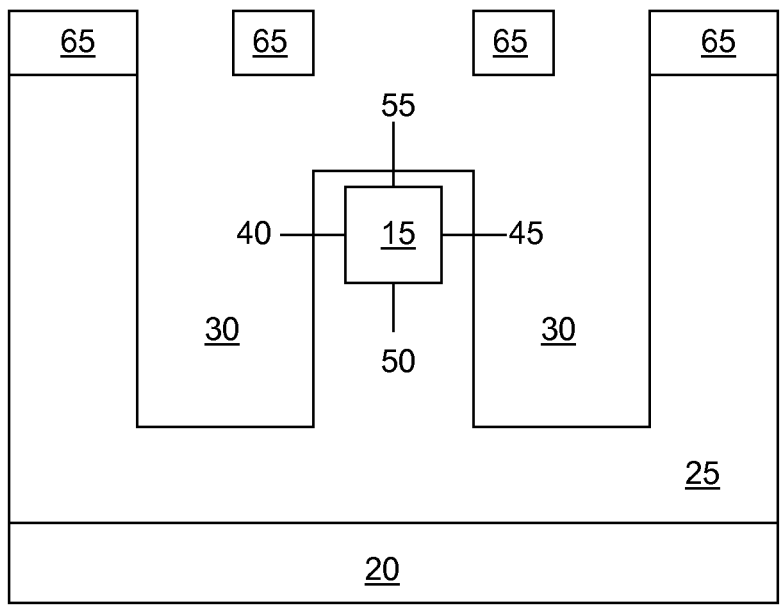

Referring to FIG. 3C, a conventional etch process (e.g., reactive ion etch using, e.g., fluorocarbon chemistry) is performed to remove exposed portions of dielectric layer 25 and form partial air gaps 72 in dielectric layer 25. Referring to FIGS. 3D and 3E, photoresist 66 is stripped and an isotropic etch using, e.g., hydrogen fluoride is performed. Portions of dielectric layer 25 that were etched away to form partial air gaps 72 are further etched resulting in crack stop void 30 adjacent to opposite sides 40 and 45 of fuse 15, and extending lower than bottom surface 50. Crack stop void 30 also extends above top surface 55 of fuse 15, see also FIG. 2. Crack stop void 30 may comprise air or a vacuum. A depth of crack stop void 30 may be defined by a distance between bottom surface 50 of fuse 15 to a bottom of the trench or any upper lining of the trench such as lining 60.

Figure 3F:
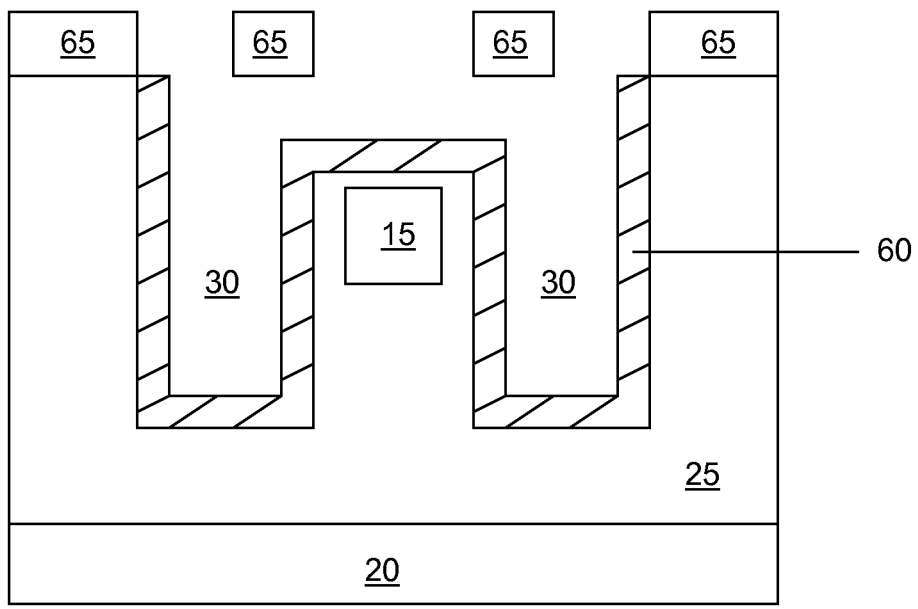
Figure 3G:
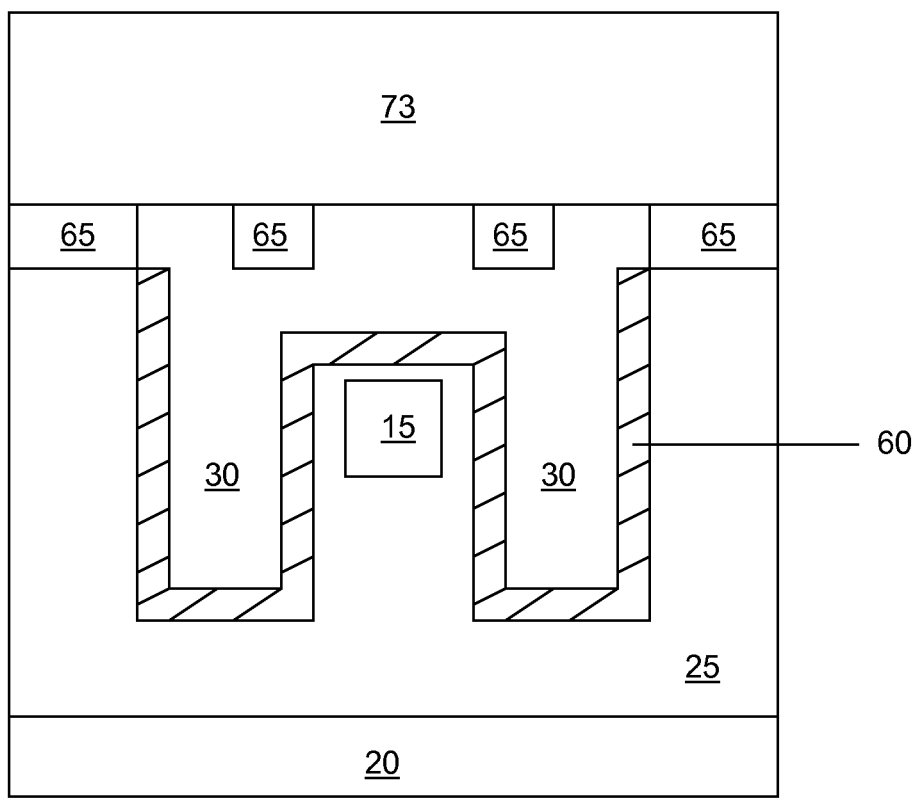

Referring to FIG. 3F, silicon nitride or silicon carbon nitride may be deposited using plasma enhanced chemical vapor deposition to form lining 60 which conformally coats an inner surface of crack stop void 30, i.e., conformally coats areas of dielectric layer 25 in contact with crack stop void 30. Referring to FIG. 3G, a second dielectric layer 73, such as $SiO_2$ or a material suitable to seal openings 70, may be nonconformally deposited on masking layer 65 so as to seal openings 70. Subsequently but not shown, additional layers, films, trenches, contact holes, etc., typically found in multilayer wiring semiconductor structures may be formed over second dielectric layer 73. One having ordinary skill in the art will recognize that the aforementioned may be formed by standard processes known in the art and that the method of forming a fuse structure described herein may be incorporated into typical manufacturing processes for multilayer wiring structures without undue experimentation.

Figure 4:
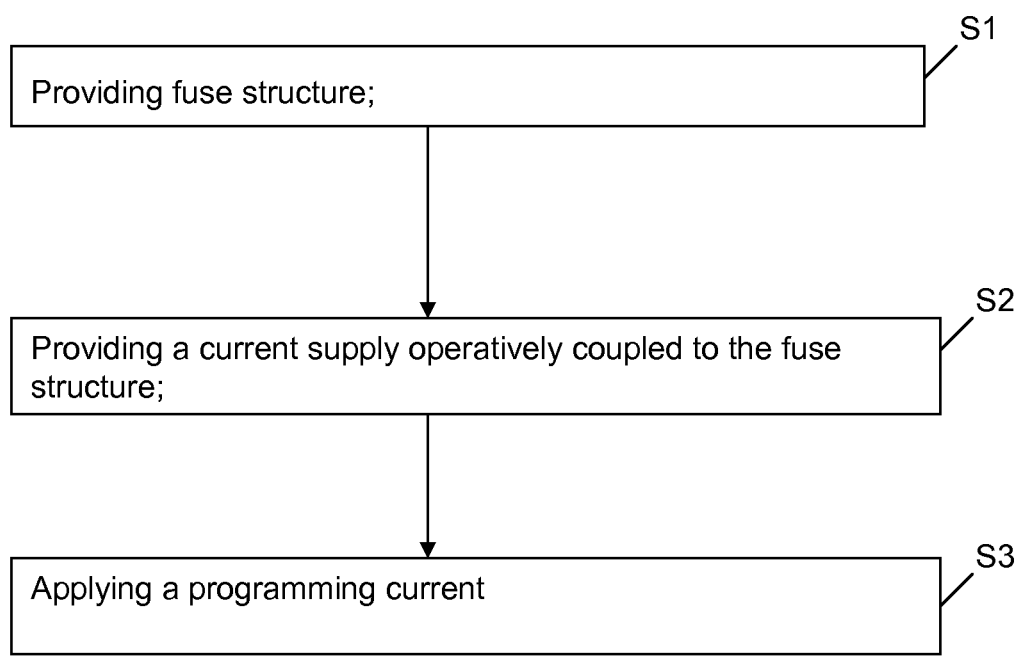
FIG. 4 depicts steps of an embodiment of a method for programming a fuse, in accordance with the present invention.

An embodiment of steps of a method for programming a fuse according to the present invention is shown in FIG. 4. Programming a fuse may refer to changing the resistance of a fuse element to a desired value(s). Referring to FIGS. 1 and 4, in step S1, fuse structure 10 described herein is provided. In step S2, a current supply (not shown) is provided and operatively coupled to fuse 15, wherein the current supply is capable of supplying an amount of current to initiate electromigration in fuse link 18. In step S3, a programming current from the current supply is applied to fuse 15. The current supply used in conjunction with the programming method includes circuitry (for example, a programmable pulse generator or other circuitry capable of producing gate voltage as a series of pulses) also operatively coupled to fuse 15 to deliver the series of multiple pulses. A programming field effect transistor used in the current supply and its operation are known in the art.

The current is applied as a series of multiple pulses, each pulse having a pulse duration $t_{on}$, a cycle duration $t_{cycle}$, an amplitude A, and a duty cycle. The duty cycle is defined as the ratio of the pulse duration to the cycle duration (or period of the cycle). Fuse 15 programming conditions may include, for example, a current of approximately 1 milliampere (mA) to approximately 100 mA for a time of approximately 0.1 millisecond (ms) to approximately 100 ms. The programming of fuse 15 is complete upon application of the programming current through the series of multiple pulses resulting in fuse 15 being blown.

Figure 5:
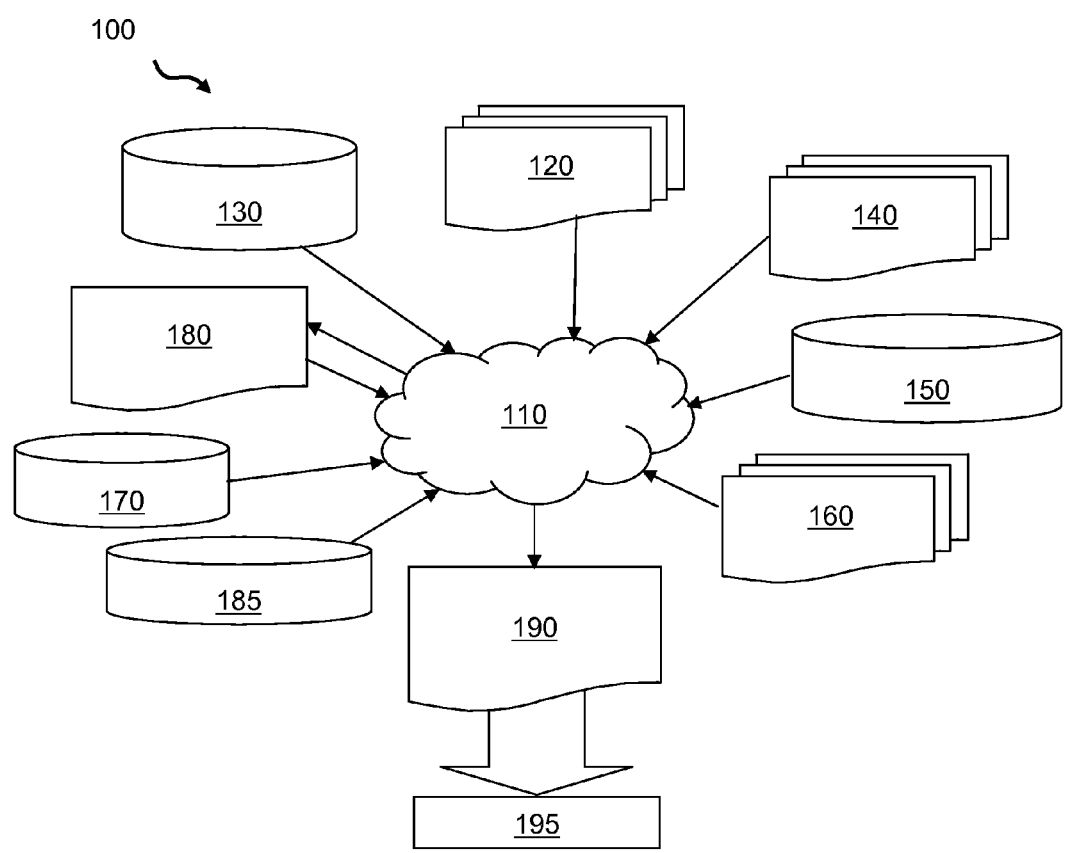
FIG. 5 depicts a flow diagram of an embodiment of a design process used in fuse structure design, manufacture, and/or test, in accordance with present invention.

A design structure embodied in a machine readable medium for designing, manufacturing, or testing fuse structure(s) is presented in accordance with the present invention. Referring to FIG. 5, a block diagram of an exemplary design flow 100 used for example, in fuse structure design, manufacturing, and/or test is shown. Design flow 100 may vary depending on the type of IC being designed. For example, a design flow 100 for building an application specific IC (ASIC) may differ from a design flow 100 for designing a standard component. Design structure 120 is preferably an input to a design process 110 and may come from an IP provider, a core developer, or other design company or may be generated by the operator of the design flow, or from other sources. Design structure 120 comprises an embodiment of the invention as shown in FIGS. 1, 2, and 3A-3G in the form of schematics or HDL, a hardware-description language (e.g., Verilog, VHDL, C, etc.). Design structure 120 may be contained on one or more machine readable medium. For example, design structure 120 may be a text file or a graphical representation of an embodiment of the invention as shown in FIGS. 1, 2, and 3A-3G. Design process 110 preferably synthesizes (or translates) an embodiment of the invention as shown in FIGS. 1, 2, and 3A-3G into a netlist 180, where netlist 180 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 180 is resynthesized one or more times depending on design specifications and parameters for the circuit.

Design process 110 may include using a variety of inputs; for example, inputs from library elements 130 which may house a set of commonly used elements, circuits, and devices, including models, layouts, and symbolic representations, for a given manufacturing technology (e.g., different technology nodes, 32 nm, 45 nm, 90 nm, etc.), design specifications 140, characterization data 150, verification data 160, design rules 170, and test data files 185 (which may include test patterns and other testing information). Design process 110 may further include, for example, standard circuit design processes such as timing analysis, verification, design rule checking, place and route operations, etc. One of ordinary skill in the art of integrated circuit design can appreciate the extent of possible electronic design automation tools and applications used in design process 110 without deviating from the scope and spirit of the invention. The design structure of the invention is not limited to any specific design flow.

Design process 110 preferably translates an embodiment of the invention as shown in FIGS. 1, 2, and 3A-3G, along with any additional integrated circuit design or data (if applicable), into a second design structure 190. Design structure 190 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 190 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2, and 3A-3G. Design structure 190 may then proceed to a stage 195 where, for example, design structure 990: proceeds to tapeout, is released to manufacturing, is released to a mask house, is sent to another design house, is sent back to the customer, etc.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A fuse structure comprising:
   a semiconductor substrate;
   a dielectric layer thereon, the dielectric layer including at least one fuse therein; and a crack stop void adjacent to two opposite sides of the fuse, and extending lower than a bottom surface and above a top surface of the fuse,
wherein an inner surface of the crack stop void includes a lining.

2. A fuse structure according to claim 1, wherein the dielectric layer comprises a first dielectric layer and a second dielectric layer.

3. A fuse structure according to claim 1, wherein the dielectric layer comprises a low-k dielectric layer.

4. A fuse structure according to claim 3, wherein the low-k dielectric layer comprises a material selected from one of hydrogen silsesquixoane polymer (HSQ), methyl silsesquixoane polymer (MSQ), polyphenylene oligomer, $SiO_x(CH_3)_y$, fluorinated TEOS (FTEOS), and fluorinated silicon glass (FSG).

5. A fuse structure according to claim 1, wherein the crack stop void comprises air or a vacuum.

6. A fuse structure according to claim 1, wherein the lining comprises a material selected from one of silicon nitride, silicon carbide, and silicon carbon nitride.

7. A method for forming a fuse structure comprising:
providing a semiconductor substrate;
forming a dielectric layer thereon;
forming at least one fuse within the dielectric layer;
forming a crack stop void adjacent to two opposite sides of the fuse, and extending lower than a bottom surface and above a top surface of the fuse; and
lining an inner surface of the crack stop void with a material selected from the group consisting of: silicon nitride, silicon carbide, and silicon carbon nitride.

8. A method for forming a fuse structure according to claim 7, wherein the dielectric layer comprises a first dielectric layer and a second dielectric layer.

9. A method for forming a fuse structure according to claim 7, wherein the dielectric layer comprises a low-k dielectric layer.

10. A method for forming a fuse structure according to claim 9, wherein the low-k dielectric layer comprises a material selected from one of hydrogen silsesquixoane polymer (HSQ), methyl silsesquixoane polymer (MSQ), polyphenylene oligomer, $SiO_x(CH_3)_y$, fluorinated TEOS (FTEOS), and fluorinated silicon glass (FSG).

11. A method for forming a fuse structure according to claim 7, wherein the crack stop void comprises air or a vacuum.

12. A design structure embodied in a machine readable medium for designing, manufacturing, or testing a fuse structure, the design structure comprising:
a semiconductor substrate;
a dielectric layer thereon, the dielectric layer including at least one fuse therein; and
a crack stop void adjacent to two opposite sides of the fuse, and extending lower than a bottom surface and above a top surface of the fuse,
wherein an inner surface of the crack stop void includes a lining.

13. The design structure of claim 12, wherein the design structure comprises a netlist.

14. The design structure of claim 12, wherein the design structure resides on storage medium as a data format for the exchange of layout data of the fuse structure.

15. The design structure of claim 12, wherein the design structure includes at least one of test data, characterization data, verification data, or design specifications.

16. A method for programming a fuse comprising:
providing a fuse structure comprising: a semiconductor substrate; a dielectric layer thereon, the dielectric layer including at least one fuse therein; and a crack stop void adjacent to two opposite sides of the fuse, and extending lower than a bottom surface and above a top surface of the fuse, wherein the providing includes lining an inner surface of the crack stop void with a material selected from the group consisting of: silicon nitride, silicon carbide, and silicon carbon nitride;
providing a current supply operatively coupled to the fuse; and
applying a programming current from the current supply to the fuse resulting in the fuse being programmed.

17. A method for programming a fuse according to claim 16, wherein the crack stop void comprises air or a vacuum.

18. A method for programming a fuse according to claim 16, wherein the programming current applying includes applying a series of multiple pulses.

19. A method for programming a fuse according to claim 16, wherein the applied programming current is in a range from approximately 1 milliampere (mA) to approximately 100 mA.

20. A method for programming a fuse according to claim 19, wherein the programming current is applied for approximately 0.1 milliseconds (ms) to approximately 100 ms.

* * * * *